US008741700B1

(12) United States Patent
Guo et al.

(10) Patent No.: US 8,741,700 B1
(45) Date of Patent: Jun. 3, 2014

(54) NON-VOLATILE GRAPHENE NANOMECHANICAL SWITCH

(71) Applicant: International Business Machines Corporation, Armonk, NY (US)

(72) Inventors: Dechao Guo, Fishkill, NY (US); Shu-Jen Han, Cortlandt Manor, NY (US); Fei Liu, Yorktown Heights, NY (US); Keith Kwong Hon Wong, Wappingers Falls, NY (US); Jun Yuan, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/971,165

(22) Filed: Aug. 20, 2013

Related U.S. Application Data (63) Continuation of application No. 13/693,285, filed on Dec. 4, 2012.

(51) Int. Cl.
*H01L 21/20* (2006.01)
(52) U.S. Cl.
USPC .......................................... 438/141; 438/146
(58) Field of Classification Search
USPC .................................................. 438/141, 146
See application file for complete search history.

(56) References Cited

U.S. PATENT DOCUMENTS

| | | | | |
|---|---|---|---|---|
| 6,534,839 | B1 * | 3/2003 | Frazier et al. | 257/421 |
| 6,701,779 | B2 * | 3/2004 | Volant et al. | 73/105 |
| 7,719,318 | B1 | 5/2010 | Nordquist et al. | |
| 2009/0020399 | A1 | 1/2009 | Kim et al. | |
| 2009/0256594 | A1 | 10/2009 | Zhu | |
| 2009/0291270 | A1 | 11/2009 | Zettl et al. | |
| 2012/0017978 | A1 * | 1/2012 | Doraiswami et al. | 136/256 |

OTHER PUBLICATIONS

Cantley, L. "Fabrication of a Three Terminal Nanomechanical Graphene Switch" 2010 NNIN REU Research Accomplishments. Aug. 2010. pp. 118-119.
Dragoman, M., et al. "Microwave Switches Based on Graphene" Journal of Applied Physics, vol. 105, Issue 5. Mar. 2009. (3 Pages).
Dragoman, M., et al. "RF NEMS Based on Carbon Nanotubes and Graphene" International Semiconductor Conference (CAS 2008). Oct. 2008. pp. 103-106.
Lee, S., et al. "A Three-Terminal Carbon Nanorelay" Nano Letters, vol. 4, No. 10. Oct. 2004. pp. 2027-2030.
Li, Q., et al. "Silicon Nanowire Electromechanical Switches for Logic Device Application" Nanotechnology, vol. 18. Jul. 2007. pp. 1-5.
Milaninia, K., et al. "All Graphene Electromechanical Switch Fabricated by Chemical Vapor Deposition" Applied Physics Letters, vol. 95, Issue 18. Nov. 2009. (3 Pages).

* cited by examiner

*Primary Examiner* — Kyoung Lee
*Assistant Examiner* — Ratisha Mehta
(74) *Attorney, Agent, or Firm* — Tutunjian & Bitetto, P.C.; Vazken Alexanian (57) ABSTRACT

Methods for making non-volatile switches include depositing gate material in a recess of a substrate; depositing drain metal in a recess of the gate material; planarizing the gate material, drain metal, and substrate; forming sidewalls by depositing material on the substrate around the gate material; forming a flexible conductive element between the sidewalls to establish a gap between the flexible conductive element and the gate material, such that the gap separating the flexible conductive element and the gate material is sized to create a negative threshold voltage at the gate material for opening a circuit; and forming a source terminal in electrical contact with the flexible conductive element.

5 Claims, 6 Drawing Sheets

NON-VOLATILE GRAPHENE NANOMECHANICAL SWITCH

RELATED APPLICATION INFORMATION

This application is a Continuation application of co-pending U.S. patent application Ser. No. 13/693,285 filed on Dec. 4, 2012, incorporated herein by reference in its entirety.

BACKGROUND

1. Technical Field

The present invention relates to nano-scale switching and, more particularly, to non-volatile nanomechanical switches that employ graphene ribbon conductors.

2. Description of the Related Art

As manufacturing methods improve, increasingly small-scale electromechanical devices can be formed. Present manufacturing methods allow for the creation of nanometer-scale electromechanical systems (NEMS). One material that may be used in such systems is graphene, an atom-thick lattice of carbon. Graphene has good electrical and mechanical properties, making it useful in NEMS switches. However, existing switches need ongoing application of energy to maintain their state.

SUMMARY

A non-volatile switch is shown that includes a gate material formed in a recess of a substrate; a flexible conductive element disposed above the gate material, separated from the gate material by a gap, where the flexible conductive element is supported on at least two points across the gap, wherein a voltage above a gate threshold voltage causes a deformation in the flexible conductive element such that the flexible conductive element comes into contact with a drain in the substrate, thereby closing a circuit between the drain and a source terminal, wherein the gap separating the flexible conductive element and the gate material is sized to create a negative threshold voltage at the gate material for opening the circuit.

A non-volatile switch is shown that includes a gate material formed in a recess of a substrate; a flexible conductive element disposed above the gate material, separated from the gate material by a gap, where the flexible conductive element is supported on at least two points across the gap, where the flexible conductive element is supported on at least two points across the gap, wherein a voltage above a gate threshold voltage causes a deformation in the flexible conductive element such that the flexible conductive element comes into contact with a drain formed in a recess centered in the substrate, thereby closing a circuit between the drain and a source terminal; and a top gate that applies a restorative force to the flexible conductive element to open the circuit when a top gate threshold is applied, wherein the gap separating the flexible conductive element and the gate material is sized such that a gate voltage of zero will not open the circuit.

A method for forming a non-volatile switch is shown that includes depositing gate material in a recess of a substrate; depositing drain metal in a recess of the gate material; planarizing the gate material, drain metal, and substrate; forming sidewalls by depositing material on the substrate around the gate material; forming a flexible conductive element between the sidewalls to establish a gap between the flexible conductive element and the gate material, wherein the gap separating the flexible conductive element and the gate material is sized to create a negative threshold voltage at the gate material for opening a circuit; and forming a source terminal in electrical contact with the flexible conductive element.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles provide a non-volatile logic switch. Graphene's elastic properties make it a suitable substance for creating an electromechanical switch. Furthermore, graphene has a high carrier density capability, making it suitable for use as a channel material, and it can be transferred to almost any substrate in, e.g., a top-down process flow. Charging a gate region causes a graphene ribbon that is connected to an electrical source to make contact with a drain region, closing the circuit. Due to the small scale of the device, the elastic restorative force within the graphene can be overcome by Van der Waals forces, creating a hysteresis effect that creates a non-volatile switch that maintains its state even if the charge in the gate region is allowed to dissipate. The overall hysteresis effect is determined by the balance between graphene elastic restorative force and the Van der Waals force between the graphene and the drain. The hysteresis effect and can be adjusted by changing the distance between graphene ribbon and the drain electrode, where a smaller distance causes larger hysteresis due to, e.g., additional contact surface area between the deformed graphene layer and the drain contact causing a stronger Van der Waals force.

Van der Waals forces, and specifically the London dispersion force, is an intermolecular force generated by spontaneous polarizations within the molecules. In isolation, a spontaneous polarization in a molecule will be transient and disappear quickly. If other molecules are present nearby, however, the spontaneous polarization in a first molecule may induce a corresponding polarization in a second molecule. This generates an attractive electrostatic dipole force between the two molecules, such that the spontaneously generated dipole does not vanish (or does so less quickly). The result is an electrostatic attraction between materials that are otherwise electrically neutral and unpolarized.

The Van der Waals forces are generally very weak, but increase in strength very quickly as the proximity increases. This is due to the inverse-distance-cubed relationship of dipole interactions. As a result, irregularities in two facing surfaces may increase the average intermolecular distance in the surfaces, reducing the overall attractive force. On the other hand, irregularities may increase the surface area, allowing a flexible material (such as graphene) will conform to the contours and experience an even higher attractive force. For the purpose of simplifying the present embodiments, it is specifically contemplated that the surfaces will be made as smooth as possible, though it should be understood that this is not limiting. Those having ordinary skill in the art would be able to select a surface configuration that best suits their purposes.

Figure 1:
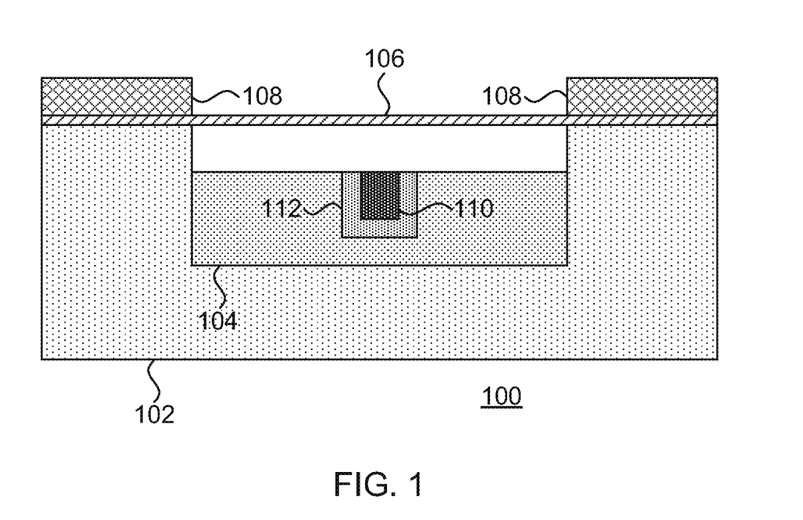
FIG. 1 is a cross-sectional view of a non-volatile graphene switch in an "open" state in accordance with the present principles.

Referring now to the drawings in which like numerals represent the same or similar elements and initially to FIG. 1, a graphene-based electromechanical switch 100 is shown. A substrate 102 is formed from, e.g., a silicon dioxide layer or other suitable dielectric. A gate material 104 is formed from, e.g., polysilicon and has a drain contact 110 formed within it with an exemplary width of about 10 μm. The drain contact 110 may be made from any suitable metal or other conductive substance, such as, e.g., a metal or silicide, and may be formed from a single electrode or an array of electrodes. The drain contact 110 may have a width smaller than that of the gate material 104 and an exemplary length of about 3 μm. The drain contact 110 is separated from the gate material 104 by a dielectric layer 112 that may be formed from any appropriate dielectric, such as an oxide, nitride, or high-k material having a thickness of several nanometers to micron-scale.

A graphene ribbon or sheet 106 is set across the gap in the substrate 102 that is occupied by the gate 104 and drain 110. The graphene layer 106 may be suspended over the gate 104 and drain 110 at an exemplary height of about 0.5 μm. A source contact 108 is set on the graphene 106, providing an electrical voltage. In the state shown in FIG. 1, the switch is in an open state. There is no voltage applied to the gate 104 and hence no deformation in the graphene layer. The physical properties of graphene are particularly advantageous, because it allows for substantial deformation while maintaining electrical conductivity. Furthermore, being only a single atom thick, the surface of graphene layer 106 is as smooth as is physically possible, such that the strength of the Van der Waals force is maximized. Although the use of graphene for layer 106 is specifically contemplated for these reasons, it is also contemplated that other materials may be used if they have suitable physical and electrical characteristics.

Figure 2:
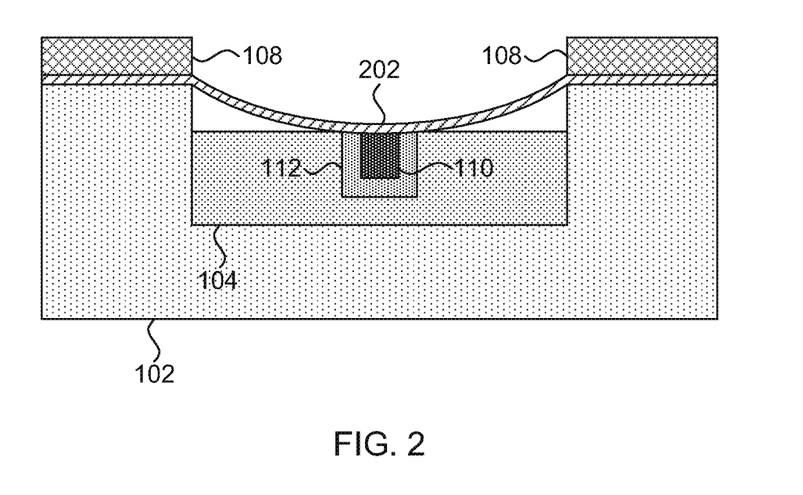
FIG. 2 is a cross-sectional view of a non-volatile graphene switch in a "closed" state in accordance with the present principles.

Referring now to FIG. 2, the switch 100 is shown in its closed state. A voltage is applied to the gate 104, causing an electrostatic attraction between the graphene channel 202 and the gate 104. The threshold voltage in this exemplary embodiment may be, for example, about 2.5V. As a result, the graphene channel 202 stretches in the direction of the gate 104. The switch 100 is symmetrically constructed, such that the graphene channel 202 will touch in the center of the gap, making contact with the drain 110. This completes the circuit, allowing current to flow from the source 108 to the drain 110 through the graphene channel 202. The drain 110 should be sized such that the deformed graphene channel 202 touches only the drain 110, without making contact with the gate 104.

Figure 3:
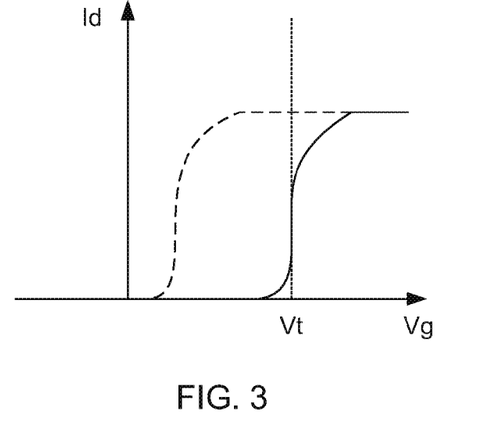
FIG. 3 is a graph illustrating threshold voltages of a graphene switch according to the present principles.

Referring now to FIG. 3, a first graph is shown that illustrates the hysteresis effect of the Van der Waals force. The vertical axis represents the current through the drain 110, while the horizontal axis represents the voltage applied to gate 104. At a threshold $V_t$, the graphene 202 touches the drain 110, causing a large increase in current. The curve produced by an increasing gate voltage is shown by the solid line in the graph. For comparison, the curve produced by a decreasing gate voltage is shown by the dashed line. For the decreasing voltage case, a different, lower threshold is evident. This is a result of the Van der Waals force causing the graphene 202 to remain in contact with the drain 110, providing an additional force to counteract the restorative elastic force of the graphene 202.

Figure 4:
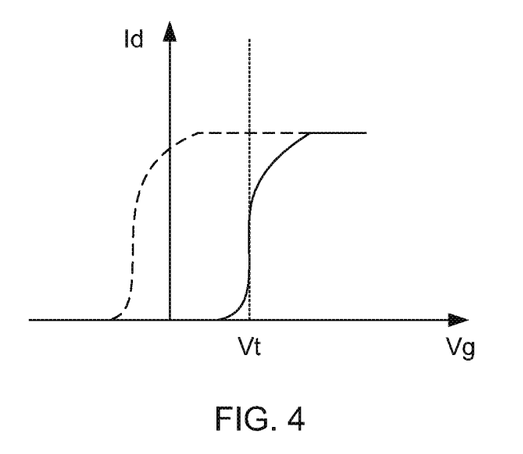
FIG. 4 is a graph illustrating threshold voltages of a non-volatile graphene switch according to the present principles.

Referring now to FIG. 4, a second graph is shown that illustrates the hysteresis effect. In this case, the gap between the gate 104 and the graphene 106 is smaller than in FIG. 3. The smaller gap moves both voltage thresholds down, with the decreasing threshold now being effectively below "zero," where the gate voltage is turned off. This effect provides non-volatility, such that the state of the switch 100 can be maintained without expending additional energy.

Figure 5:
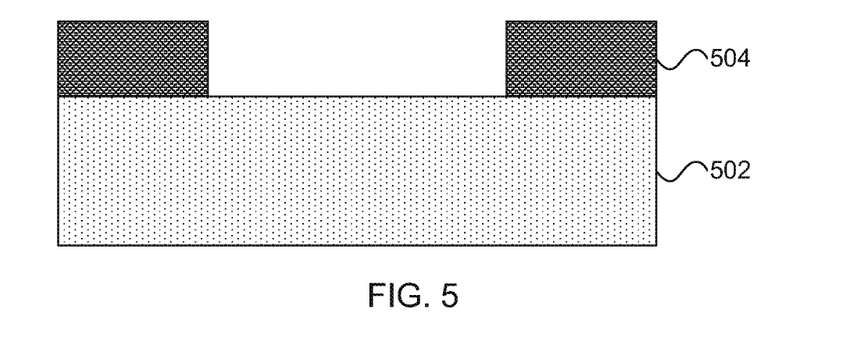
FIG. 5 is a diagram of a step of forming a non-volatile graphene switch according to the present principles.

Referring now to FIG. 5, a first step in forming a non-volatile graphene switch 100 is shown. A substrate 502 is formed from any suitable material. In the present embodiments the substrate 502 is specifically contemplated as being silicon dioxide, this is not intended to be limiting. A resist 504 is patterned onto the substrate 502 to delineate an area for the formation of a switch gap. Reactive ion etching (RIE) is applied to the substrate 502 to remove material that is not covered by the resist 504. This etch should be anisotropic, such that material is removed vertically without undercutting the resist 504.

Figure 6:
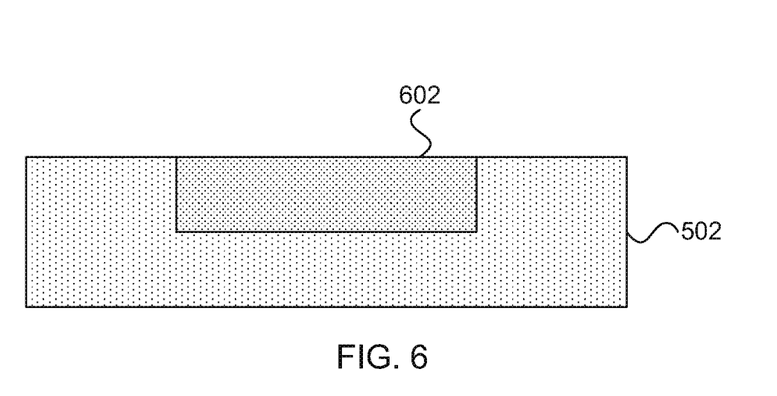
FIG. 6 is a diagram of a step of forming a non-volatile graphene switch according to the present principles.

Referring now to FIG. 6, a poly-silicon gate material 602 is deposited in the gap of the substrate 502. The resist 504 is removed and any irregularities in the surface of the substrate 502 and the gate material 602 are removed by chemical-mechanical planarization (CMP). The poly-silicon gate material 602 is then implanted with ions to make it suitable for triggering the switch 100. This doping may use, e.g., a standard implant doping dose of As, P, B, $BF_2$, etc., to make the poly-silicon gate material highly doped, with an exemplary concentration of about $1\times10^{19}$ cm$^{-3}$ to about $1\times10^{21}$ cm$^{-3}$.

Figure 7:
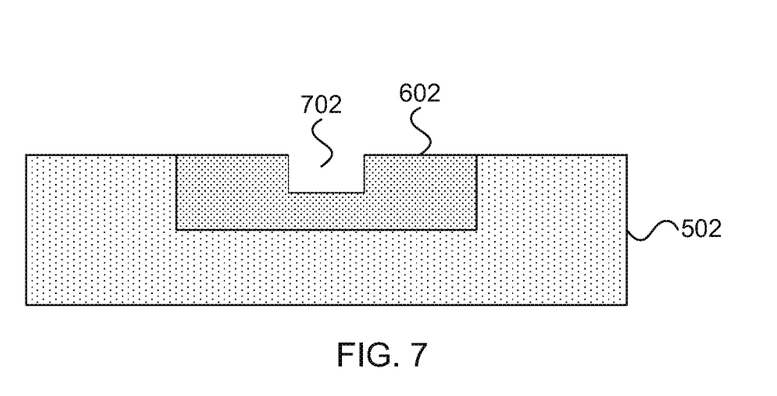
FIG. 7 is a diagram of a step of forming a non-volatile graphene switch according to the present principles.

Referring now to FIG. 7, the gate material 602 is etched to create a drain recess 702. Any appropriate etch may be employed, though it is specifically contemplated that an anisotropic RIE may be used. It should be understood that the drain recess 702 is sized to accommodate a dielectric layer and the drain contact 110. This size corresponds inversely to the gap between graphene layer 106 and gate 104, as a smaller gap may increase the area of contact, necessitating a larger surface area for drain contact 110.

Figure 8:
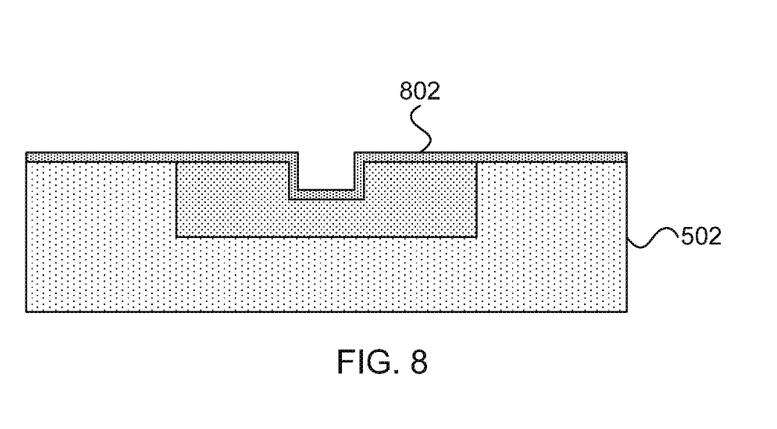
FIG. 8 is a diagram of a step of forming a non-volatile graphene switch according to the present principles.

Referring now to FIG. 8, a dielectric is deposited on the surface of the substrate 502 and the gate material 602. The dielectric 802 serves to create an insulation layer between the gate material 602 and the eventual drain 110, and so many different dielectric materials will be appropriate for use. It is contemplated that those having ordinary skill in the art will be able to select an appropriate dielectric material according to the needs of the particular embodiment and the available materials and fabrication techniques.

Figure 9:
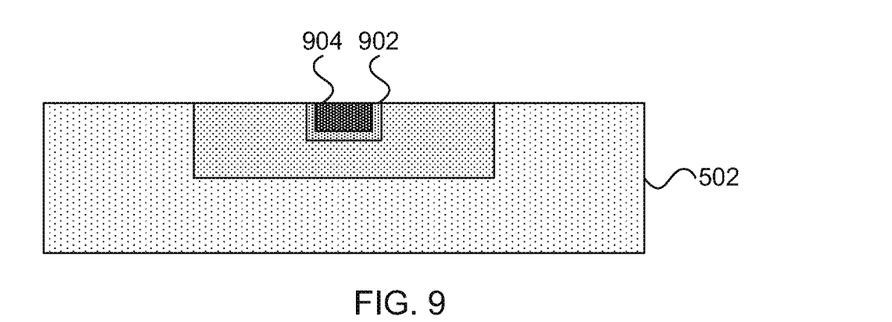
FIG. 9 is a diagram of a step of forming a non-volatile graphene switch according to the present principles.

Referring now to FIG. 9, a drain metal 904 is deposited in the gap 702. The drain metal 904 forms an electrical contact for drain 110 and may be formed from any suitable material such as, e.g., aluminum, copper, or gold. The surface is smoothed using, e.g., CMP, such that the surface of the gate material 602 is exposed and made even with the surface of the drain metal 904. CMP provides a flat surface to maximize the Van der Waals forces produced by contact between the deformable layer 106 and the drain contact 110.

Figure 10:
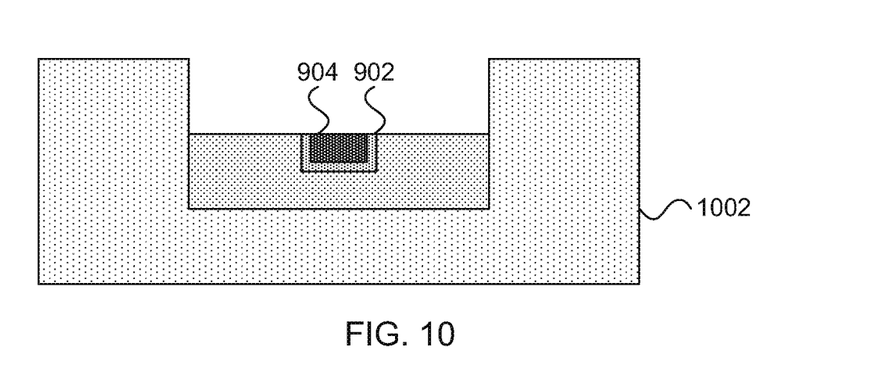
FIG. 10 is a diagram of a step of forming a non-volatile graphene switch according to the present principles.

Referring now to FIG. 10, additional dielectric material is deposited onto substrate 502 to form extended substrate 1002. It is specifically contemplated that the new material will be formed from the same material as the substrate 502: in this case, silicon dioxide. The height of the added material is selected according to the desired threshold voltage and hysteresis effects of the switch 100. As shown above in FIGS. 3 and 4, the depth of the cavity formed by extended substrate 1002 determines the electrical properties of the switch 100. The depth of the cavity may range from, e.g., several nanometers to the micron scale and has an exemplary value of about 0.5 µm. The threshold voltage may range from, e.g., several tenths of a volt to tens of volts and has an exemplary value of about 2.5V.

Figure 11:
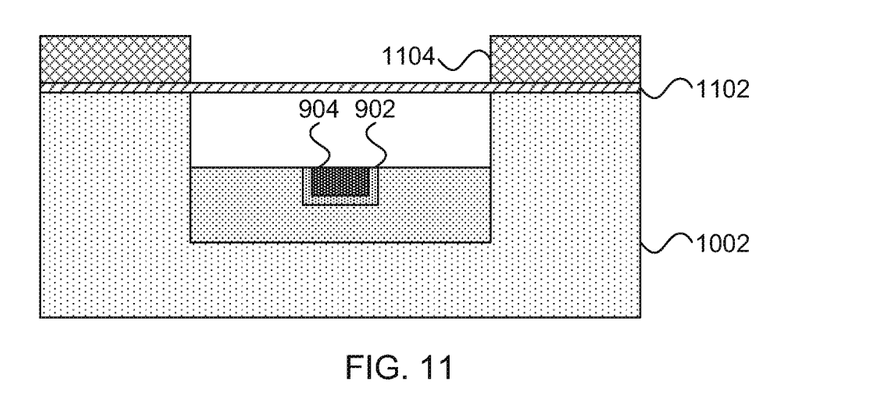
FIG. 11 is a diagram of a step of forming a non-volatile graphene switch according to the present principles.

Referring now to FIG. 11, the switch 100 is completed by the addition of a graphene ribbon or sheet 1102 and source terminals 1104. According to one exemplary transfer method, the graphene 1102 may be formed on a separate substrate, e.g., copper. A handling layer of, e.g., poly(methyl methacrylate) (PMMA) is formed on the graphene 1102 and the copper substrate is dissolved. The PMMA layer is then used to manipulate the graphene 1102 into position in contact with the extended substrate 1002. The PMMA layer is removed by any appropriate process, leaving the graphene 1102 extending across a gap and supported on two sides by the extended substrate 1002. Source terminals 1104 can then be added with a metal lift-off process and may be formed from any material suitable for electrical contacts.

Figure 12:
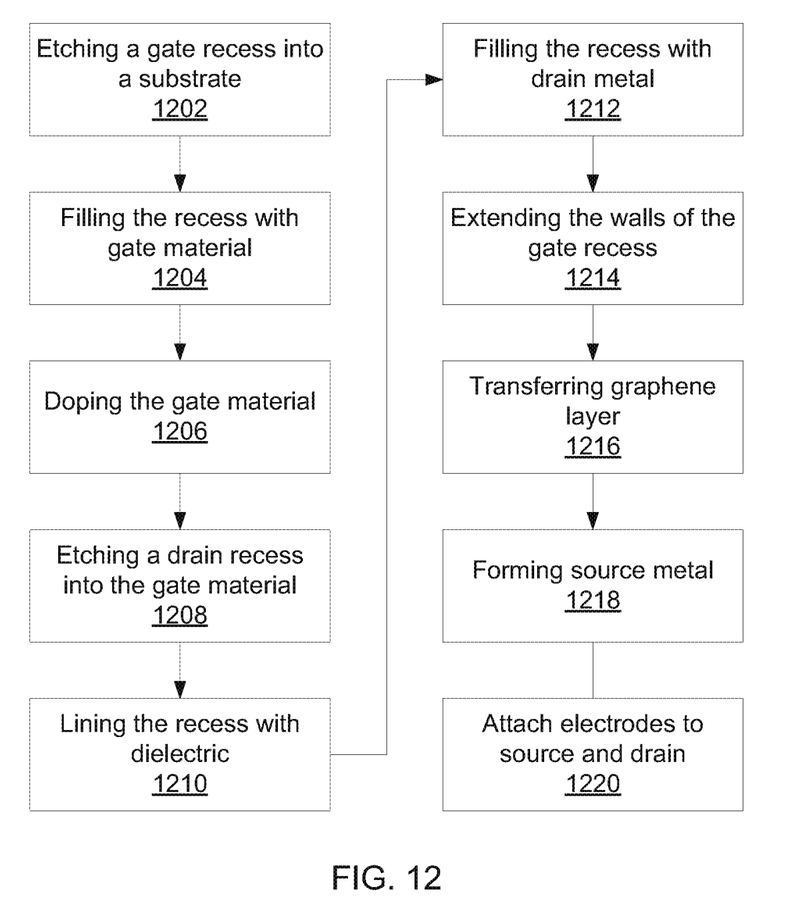
FIG. 12 is a block/flow diagram of fabricating a non-volatile graphene switch according to the present principles.

Referring now to FIG. 12, a method for forming a non-volatile graphene switch 100 is shown. Block 1202 etches a gate recess into a substrate 502, as shown above in FIG. 5. This substrate 502 may be formed from any suitable substance, and it is specifically contemplated that silicon dioxide may be used. The etch may be an anisotropic RIE, though it is contemplated that any suitable etch may be used instead.

Block 1204 fills the recess with gate material 602, which is then doped at block 1206 by, e.g., ion implantation. The gate material is specifically contemplated as being poly-silicon, but it is contemplated that any suitable gate material can be used instead. Block 1208 etches a drain recess 702 into the gate material 602 and block 1210 lines the drain recess 702 with a dielectric 902. Any suitable dielectric material may be used, as the dielectric's role is to insulate the drain 110. Block 1212 fills the recess 702 with a gate metal 904, such as aluminum.

Block 1214 extends the walls of the gate recess by adding additional material to the substrate 502. The height of these walls dictate the electromechanical properties of the switch, in particular determining the threshold voltages for changing the switch's state. This height controls the distance between graphene layer 106 and the drain contact 110, where larger separations mean that a larger voltage threshold needs to be met to bring the graphene layer 106 into contact. Block 1216 transfers, e.g., a graphene layer 1102 onto the recess walls, e.g., as described above, by forming the graphene layer 1102 separately and then manipulating it into place. Any suitable technique for forming and transferring graphene may be used instead, and it is contemplated that those having ordinary skill in the art will be able to select a graphene transfer technique suitable for their particular application. Further, it should be understood that the use of graphene in the present embodiments is not intended to be limiting, and that any suitably flexible, conductive material may be used instead. Block 1218 forms a source metal 1104 at the graphene layer 1102. The gate 104, source 108, and drain 110 of the completed switch 110 are then connected to electrodes that control the operation of the switch 110 in block 1220.

Figure 13:
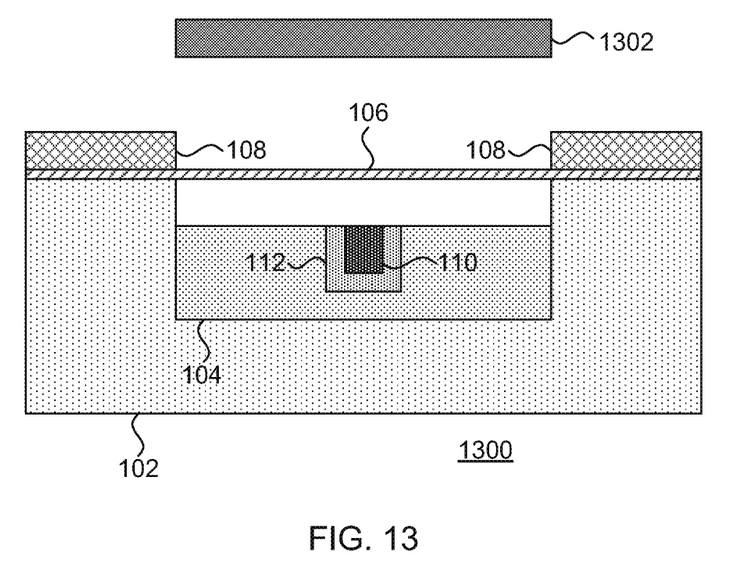
FIG. 13 is a diagram of an alternative embodiment of a non-volatile graphene switch according to the present principles.

Referring now to FIG. 13, an alternative embodiment of a non-volatile graphene switch 1300 is shown. This switch 1300 has an additional top gate 1302 formed from any appropriate material and positioned above the gate 104. The top gate 1302 may be formed from metal, poly-silicon, or any other convenient conductive material. The top gate 1302 operates to provide a restorative force on the graphene 106 when a voltage is applied. This contrasts to the embodiment of FIG. 1, where resetting the switch involves applying a reversed voltage to the gate material 104, repelling the graphene 106. Thus, the embodiment of FIG. 13 using top gate 1302 may be simpler to wire in some circumstances, where reversing the polarity of the voltage applied to gate material 104 might be difficult.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip of photovoltaic device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Having described preferred embodiments of a non-volatile graphene nanomechanical switch and method of fabrication (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a non-volatile switch, comprising:
    depositing gate material in a recess of a substrate;
    depositing drain metal in a recess of the gate material;
    planarizing the gate material, drain metal, and substrate;
    forming sidewalls by depositing material on the substrate around the gate material;
    forming a flexible conductive element between the sidewalls to establish a gap between the flexible conductive element and the gate material, wherein the gap separating the flexible conductive element and the gate material is sized to create a negative threshold voltage at the gate material for opening a circuit; and
    forming a source terminal in electrical contact with the flexible conductive element.

2. The method of claim 1, wherein the flexible conductive element is formed from graphene.

3. The method of claim 2, wherein the flexible conductive element is a graphene ribbon.

4. The method of claim 1, further comprising forming a top gate that applies a restorative force to the flexible conductive element to open the circuit when a top threshold voltage is applied.

5. The method of claim 1, wherein the source terminal is formed over the flexible conductive element.

* * * * *